United States Patent
Okuyama et al.

(10) Patent No.: US 9,523,034 B2
(45) Date of Patent: Dec. 20, 2016

(54) PHOSPHOR, LIGHT-EMITTING DEVICE INCLUDING SAID PHOSPHOR, PROJECTOR, HEAD-UP DISPLAY AND VEHICLE INCLUDING SAID LIGHT-EMITTING DEVICE

(71) Applicant: Panasonic Intellectual Property Management Co., Ltd., Osaka (JP)

(72) Inventors: Kojiro Okuyama, Nara (JP); Seigo Shiraishi, Osaka (JP); Mitsuru Nitta, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 36 days.

(21) Appl. No.: 14/748,274

(22) Filed: Jun. 24, 2015

(65) Prior Publication Data

US 2015/0291880 A1    Oct. 15, 2015

Related U.S. Application Data

(63) Continuation of application No. PCT/JP2014/001502, filed on Mar. 17, 2014.

(30) Foreign Application Priority Data

May 14, 2013 (JP) .................................. 2013-102366

(51) Int. Cl.
*H01J 1/62* (2006.01)
*H01J 63/04* (2006.01)
(Continued)

(52) U.S. Cl.
CPC .............. *C09K 11/7734* (2013.01); *F21S 2/00* (2013.01); *F21S 48/1145* (2013.01);
(Continued)

(58) Field of Classification Search
CPC ............ F21K 2/08; H01J 63/00; H05B 33/20; H05B 33/10
(Continued)

(56) References Cited

U.S. PATENT DOCUMENTS 7,679,101 B2 * 3/2010 Ota et al. ....................... 257/100
8,013,506 B2 * 9/2011 Bukesov et al. ............... 313/483
(Continued)

FOREIGN PATENT DOCUMENTS

JP    2006-012770    1/2006
JP    2008-208203    9/2008
(Continued)

OTHER PUBLICATIONS

International Search Report of PCT application No. PCT/JP2014/001502 dated Jun. 10, 2014.

*Primary Examiner* — James Greece
(74) *Attorney, Agent, or Firm* — McDermott Will & Emery LLP

(57) ABSTRACT

A phosphor includes a host crystal including $Sr_3MgSi_2O_8$ crystal and $SrMgSiO_4$ crystal and also includes $Eu^{2+}$, or $Eu^{2+}$ and $Mn^{2+}$ as luminescent centers. Alternatively, a phosphor includes a host crystal including $Sr_3MgSi_2O_8$ crystal and $SrMgSiO_4$ and also includes $Eu^{2+}$ as a luminescent center, the phosphor being free from $Mn^{2+}$ as a luminescent center. A light-emitting device includes a phosphor layer containing the phosphor. A projector and a vehicle include the light-emitting device.

14 Claims, 4 Drawing Sheets

(51) Int. Cl.
  *C09K 11/77*   (2006.01)
  *F21S 2/00*    (2016.01)
  *F21V 9/08*    (2006.01)
  *F21S 8/10*    (2006.01)
  *H01L 33/50*   (2010.01)
  *G02B 27/01*   (2006.01)
  *H01L 33/32*   (2010.01)
  *G03B 21/20*   (2006.01)

(52) U.S. Cl.
  CPC ............ *F21S 48/1225* (2013.01); *F21V 9/08* (2013.01); *G02B 27/0101* (2013.01); *H01L 33/32* (2013.01); *H01L 33/502* (2013.01); *G02B 2027/0112* (2013.01); *G03B 21/204* (2013.01)

(58) Field of Classification Search
  USPC .................. 359/630; 313/483, 485, 486, 496, 313/502–504
  See application file for complete search history.

(56) References Cited

U.S. PATENT DOCUMENTS

| | | |
|---|---|---|
| 2005/0264161 A1 | 12/2005 | Oaku et al. |
| 2010/0214763 A1 | 8/2010 | Katou et al. |
| 2013/0200777 A1 | 8/2013 | Inagaki et al. |

FOREIGN PATENT DOCUMENTS

| | | |
|---|---|---|
| JP | 2010-006850 | 1/2010 |
| WO | 2008/078711 | 7/2008 |
| WO | 2012/033122 | 3/2012 |

\* cited by examiner

PHOSPHOR, LIGHT-EMITTING DEVICE INCLUDING SAID PHOSPHOR, PROJECTOR, HEAD-UP DISPLAY AND VEHICLE INCLUDING SAID LIGHT-EMITTING DEVICE

BACKGROUND

1. Technical Field

The present disclosure relates to a phosphor including $Sr_3MgSi_2O_8$ crystal as the host crystal, and to a light-emitting device having the phosphor. The present disclosure also relates to a projector, a head-up display and a vehicle including the light-emitting device.

2. Description of the Related Art

In recent years, the use of white LEDs has been widespread from the viewpoint of energy saving. A general white LED uses a blue light-emitting element (for example, a blue LED chip) and a phosphor that converts part of the light from the blue LED chip. Specifically, the white LED produces white light by mixing the blue light from the blue LED chip with the light from the phosphor.

A combination of a blue LED chip and a yellow phosphor is the mainstream of white LEDs. To realize higher performances such as color rendering properties and color reproducibility, development is underway on white LEDs that are combinations of a near-ultraviolet to blue-violet LED and three types of phosphors, namely, blue phosphor, green phosphor and red phosphor.

Further, light sources using a combination of a near-ultraviolet to blue-violet laser diode (LD) and a phosphor are under development for use in applications that require high emission energy such as projector light sources and light sources for vehicle headlights.

A phosphor represented by $Sr_3MgSi_2O_8$:$Eu^{2+}$ (SMS phosphor) is known as a blue phosphor and is studied for use in white LEDs (see International Publication No. WO 2012/033122).

SUMMARY

The existing techniques have a drawback in that the luminescence quantum efficiency of SMS phosphors is low and consequently have a difficulty in realizing light-emitting devices with high efficiency. One non-limiting and exemplary embodiment of the present disclosure enhances the luminescence quantum efficiency of SMS phosphors.

In one general aspect, the techniques disclosed here feature a phosphor which includes a host crystal including $Sr_3MgSi_2O_8$ crystal and $SrMgSiO_4$ crystal and also includes $Eu^{2+}$, or $Eu^{2+}$ and $Mn^{2+}$ as luminescent centers.

The SMS phosphor according to the present disclosure achieves an increase in luminescence quantum efficiency.

It should be noted that general or specific embodiments may be implemented as a device, a projector, a head-up display, a vehicle, a system, a method, or any selective combination thereof. Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
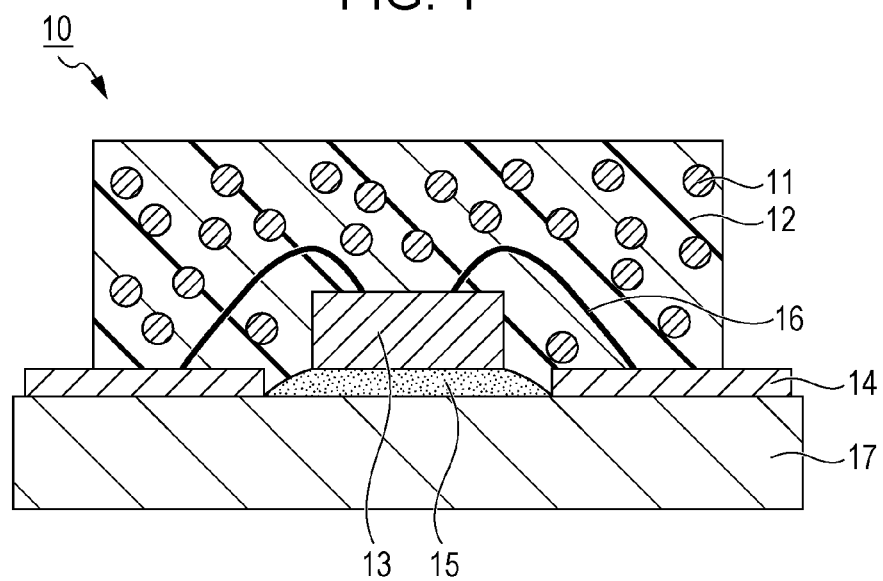
FIG. 1 is a schematic sectional view illustrating an example of light-emitting devices according to a second embodiment of the present disclosure.

The present disclosure will be described in detail hereinbelow based on specific embodiments. It is needless to mention that the scope of the present disclosure is not limited to such embodiments and various modifications thereto are possible without departing from the technical scope of the present disclosure.

An aspect of the present disclosure resides in a phosphor which includes a host crystal including $Sr_3MgSi_2O_8$ crystal and $SrMgSiO_4$ crystal and also includes $Eu^{2+}$, or $Eu^{2+}$ and $Mn^{2+}$ as luminescent centers. In the present embodiment, the phosphor may have $Eu^{2+}$ alone as the luminescent center without $Mn^{2+}$.

The phosphor may have diffraction peaks at $2\theta$ of 22° to 23°, $2\theta$ of 30.6° to 31.7° and $2\theta$ of 31.8° to 32.8° and may also have diffraction peaks at $2\theta$ of 28° to 30.4° and $2\theta$ of 34° to 35.5° in an X-ray diffraction pattern measured with Cu—K$\alpha$ radiation.

The phosphor may satisfy $0.01 \le a \le 0.18$ wherein a is a value of the ratio c/b wherein b is the intensity of the largest diffraction peak assigned to the $Sr_3MgSi_2O_8$ crystal present at $2\theta$ of 31.8° to 32.8° in an X-ray diffraction pattern of the phosphor measured with Cu—K$\alpha$ radiation, and c is the intensity of the largest diffraction peak assigned to the $SrMgSiO_4$ crystal present at $2\theta$ of 34° to 35.5° in the X-ray diffraction pattern.

The host crystal of the phosphor may have a composition represented by the general formula $Sr_{3+j}Mg_{1+k}Si_{2+m}O_{8+n}$ ($0 < j \le 1.0$, $0 < k \le 1.0$, $0 < m \le 1.0$, and $0 < n \le 4.0$).

Another aspect of the present disclosure resides in a light-emitting device that includes a phosphor layer containing the phosphor.

The light-emitting device may further include a semiconductor light-emitting element that emits light having a peak wavelength in the wavelength range of 380 nm to 420 nm, and the phosphor in the phosphor layer may be capable of absorbing at least part of the light emitted from the semiconductor light-emitting element and of emitting light having a peak wavelength in a range of wavelengths longer than the light absorbed by the phosphor.

The semiconductor light-emitting element may have an emitting layer including a gallium nitride compound semiconductor.

Another aspect of the present disclosure resides in a projection unit including the light-emitting device.

The projection unit may further include an image generator that generates an image using light emitted from the light-emitting device, and an output optical system that outputs the image generated by the image generator.

Another aspect of the present disclosure resides in a vehicle including the light-emitting device.

The vehicle may include a headlight including the light-emitting device and an output optical system that outputs light from the light-emitting device toward the front of the headlight.

First Embodiment

The first embodiment is directed to a phosphor which includes $Sr_3MgSi_2O_8$ crystal and $SrMgSiO_4$ crystal as a host crystal and also includes $Eu^{2+}$, or $Eu^{2+}$ and $Mn^{2+}$ as luminescent centers.

After extensive studies, the present inventors have found that $Sr_3MgSi_2O_8$:$Eu^{2+}$ phosphors in which the host crystal is a mixed crystal of $Sr_3MgSi_2O_8$ and $SrMgSiO_4$ (namely, a $Sr_3MgSi_2O_8$ crystal phase and a $SrMgSiO_4$ crystal phase are present in a single crystal grain) exhibit higher luminescence quantum efficiency than $Sr_3MgSi_2O_8$:$Eu^{2+}$ phosphors whose host crystal is a single $Sr_3MgSi_2O_8$ crystal phase.

The presence of the two types of crystals, namely, the $Sr_3MgSi_2O_8$ crystal and the $SrMgSiO_4$ crystal in the host crystal of the phosphor may be confirmed by, for example, measuring an X-ray diffraction pattern of the phosphor. When, for example, the phosphor of the present embodiment is analyzed by X-ray diffractometry using Cu—Kα radiation, the diffraction pattern has diffraction peaks at 2θ of 22° to 23°, 2θ of 30.6° to 31.7° and 2θ of 31.8° to 32.8°. These peaks are assigned to the $Sr_3MgSi_2O_8$ crystal. In addition, the diffraction pattern has diffraction peaks at 2θ of 28° to 30.4° and 2θ of 34° to 35.5° which are assigned to the $SrMgSiO_4$ crystal.

The $Sr_3MgSi_2O_8$ crystal and the $SrMgSiO_4$ crystal may be present in any ratio without limitation. For example, an X-ray diffraction pattern measured with Cu—Kα radiation satisfies 0.01≤a≤0.18 wherein a is a value of the ratio c/b wherein b is the intensity of the largest diffraction peak assigned to the $Sr_3MgSi_2O_8$ crystal present at 2θ of 31.8° to 32.8° and c is the intensity of the largest diffraction peak assigned to the $SrMgSiO_4$ crystal present at 2θ of 34° to 35.5°. When this ratio is satisfied, the phosphor exhibits very high quantum efficiency. Particularly high quantum efficiency may be obtained when the ratio "a" satisfies 0.03≤a≤0.06.

The composition of the host crystal of the phosphor is not particularly limited as long as the host crystal includes the $Sr_3MgSi_2O_8$ crystal and the $SrMgSiO_4$ crystal. For example, the host crystal of the phosphor has a composition represented by the general formula $Sr_{330-j}Mg_{1+k}Si_{2+m}O_{8+n}$ (0<j≤1.0, 0<k≤1.0, 0<m≤1.0, and 0<n≤4.0). In this case, very high quantum efficiency may be obtained. In another example, the host crystal of the phosphor has a composition represented by $Sr_{3+j}Mg_{1+j}Si_{2+j}O_{8+4j}$ (0<j≤1.0).

The phosphor of the present embodiment includes $Eu^{2+}$ as a luminescent center, and may further include $Mn^{2+}$ as an additional luminescent center. That is, the phosphor of the present embodiment may include $Mn^{2+}$ as a luminescent center or may be free from $Mn^{2+}$. When the luminescent center is $Eu^{2+}$, the phosphor emits blue light. When the luminescent centers include both $Eu^{2+}$ and $Mn^{2+}$, the phosphor is capable of dual emission, namely, can emit blue light and red light. Specifically, the phosphor has different purposes and properties depending on whether or not the luminescent centers include $Mn^{2+}$, but enhanced emission efficiency may be obtained in any case.

The Eu content in the phosphor is not particularly limited as long as the phosphor can emit light. For example, the Eu content is 0.1 at % to 10 at % relative to strontium. Particularly high emission efficiency may be obtained when the Eu content in the phosphor is 0.5 at % to 9 at % relative to strontium. The Mn content in the phosphor is not particularly limited as long as the phosphor can emit light. For example, the Mn content is 0.1 at % to 20 at % relative to magnesium.

Next, an example of the methods for producing the phosphors of the present embodiment will be described.

The raw material for strontium in the phosphor of the present embodiment may be high-purity (for example, 99% or higher purity) strontium oxide, or a high-purity (for example, 99% or higher purity) strontium compound which may be converted into strontium oxide by calcination with examples including strontium hydroxide, strontium carbonate, strontium nitrate, strontium halide and strontium oxalate.

The raw material for magnesium may be high-purity (for example, 99% or higher purity) magnesium oxide, or a high-purity (for example, 99% or higher purity) magnesium compound which may be converted into magnesium oxide by calcination with examples including magnesium hydroxide, magnesium carbonate, magnesium nitrate, magnesium halide, magnesium oxalate and basic magnesium carbonate.

The raw material for europium may be high-purity (for example, 99% or higher purity) europium oxide, or a high-purity (for example, 99% or higher purity) europium compound which may be converted into europium oxide by calcination with examples including europium hydroxide, europium carbonate, europium nitrate, europium halide and europium oxalate.

The raw material for silicon may be any of various oxides.

To promote the reaction, it is preferable to add small amounts of fluorides (for example, aluminum fluoride) and chlorides (for example, calcium chloride).

The phosphor may be produced by mixing the raw materials and calcining the mixture. The raw materials may be mixed by a wet process in a solution or may be mixed by a dry process in the form of dry powder. Use may be made of a mixing device usually used in industry such as a ball mill, a medium stirring mill, a planetary mill, an oscillating mill, a jet mill, a twin-cylinder mixer or a stirrer.

In the mixing of the raw materials, the raw materials are mixed in a ratio that is shifted from the composition $Sr_3MgSi_2O_8$ and is adjusted so that $Sr_3MgSi_2O_8$ crystal and $SrMgSiO_4$ crystal will be formed. These two types of crystal phases may be formed even when the composition of the host crystal is out of $Sr_{3+j}Mg_{1+j}Si_{2+j}O_{8+4j}$. An easy way to obtain the phosphor of the present embodiment is to adjust the mixing ratio of the raw materials so that the composition will be represented by $Sr_{3+j}Mg_{1+j}Si_{2+j}O_{8+4j}$ (0<j≤1.0) or similar thereto (for example, $Sr_{3+j}Mg_{1+k}Si_{2+m}O_{8+n}$ (0<j≤1.0, 0<k≤1.0, 0<m≤1.0, and 0<n≤4.0)). The mixing ratio of the raw materials is not particularly limited as long as the $Sr_3MgSi_2O_8$ crystal and the $SrMgSiO_4$ crystal are formed.

The calcination of the powdery mixture is performed in a reducing atmosphere (for example, a nitrogen-hydrogen mixture gas atmosphere) at a temperature in the range of 1100 to 1500° C. for about 1 to 50 hours.

The calcination may involve any of common furnaces used in industry. For example, a continuous furnace such as a pusher furnace, or a batch furnace may be used. The furnace may be electric or gas furnace.

When the raw materials are compounds such as hydroxides, carbonate salts, nitrate salts, halides or oxalate salts which may be converted into oxides by calcination, it is preferable to pre-calcine the mixture at a temperature in the range of 800 to 1400° C. prior to the main calcination.

The resultant phosphor powder may be crushed again with a device such as a ball mill or a jet mill and may be further washed or classified as required. In this manner, the grain size distribution and the flowability of the phosphor powder may be controlled.

The phosphor of the present embodiment achieves higher quantum efficiency in the emission of light in the $Sr_3MgSi_2O_8$ crystal as compared to $Sr_3MgSi_2O_8:Eu^{2+}$ phosphors in which the host crystal is a single $Sr_3MgSi_2O_8$ crystal phase. Thus, the use of the phosphor of the present embodiment in a light-emitting device makes it possible to improve the efficiency of the light-emitting device.

Second Embodiment

The second embodiment is directed to a light-emitting device that includes a phosphor layer containing the phosphor of the first embodiment. Examples of the light-emitting devices include those devices which use light-emitting diodes (LEDs) or semiconductor laser diodes (LDs) and phosphors, specifically, light sources for projection units such as projectors and head-up displays; light sources for vehicle headlights; light sources for white LED lights such as spot lights, ceiling lights and vehicle room lamps; flash light sources for image recording apparatuses such as digital cameras, mobile phones and smart phones; and backlight sources for liquid crystal displays such as personal computer (PC) monitors, notebook personal computers, televisions, personal digital assistances (PDAs), smart phones, tablet PCs and mobile phones; as well as include those devices which use phosphors, specifically, sensors, intensifiers and plasma display panels (PDPs).

A specific configuration of the light-emitting devices of the second embodiment will be described below with reference to the drawing, but the scope of the present disclosure is not limited to such a configuration. FIG. 1 is a schematic sectional view illustrating an example of the light-emitting devices according to the second embodiment.

A light-emitting device 10 has a phosphor layer which includes a resin 12 and a phosphor 11 dispersed in the resin 12, and further has a semiconductor light-emitting element 13. The semiconductor light-emitting element 13 is fixed on a substrate 17 via a die bond 15. Further, the semiconductor light-emitting element 13 is electrically connected to electrodes 14 through bonding wires 16. When a prescribed voltage is applied to the electrodes 14, the semiconductor light-emitting element 13 emits light having a peak wavelength in the wavelength range of, for example, 380 nm to 420 nm (near-ultraviolet to blue-violet region). For example, the semiconductor light-emitting element 13 may be one which has an emitting layer including a gallium nitride compound semiconductor. For example, the semiconductor light-emitting element 13 is an LD or an LED. The phosphor 11 absorbs at least part of the light emitted from the semiconductor light-emitting element 13 and emits light having a peak wavelength in a range of wavelengths longer than the light absorbed by the phosphor. The phosphor 11 includes the phosphor of the first embodiment as a blue phosphor, and further includes a yellow phosphor. As a result of the phosphor 11 being a mixture of the phosphor of the first embodiment and a yellow phosphor, the light-emitting device 10 emits light in white that is a mixed color of the blue light and the yellow light. The phosphor 11 is not limited to the one described above and may be, for example, a mixture of the phosphor of the first embodiment as a blue phosphor with a green phosphor and a red phosphor. For example, the yellow phosphor, the green phosphor and the red phosphor may be known phosphors.

The light-emitting device may be configured to emit light in a color other than white by using the phosphor of the first embodiment alone or in combination with phosphors capable of emitting other colors.

The light-emitting device 10 may have a filter that blocks light having wavelengths of 420 nm or less.

Besides the configurations described above, the light-emitting device of the second embodiment may be configured such that it has a UV light generator and a phosphor layer containing the phosphor of the first embodiment and the phosphor is caused to emit light by the action of UV light generated from the UV light generator.

Third Embodiment

The third embodiment is directed to a projection unit including the light-emitting device of the second embodiment. For example, the projection unit is a projector or a head-up display.

Figure 2:
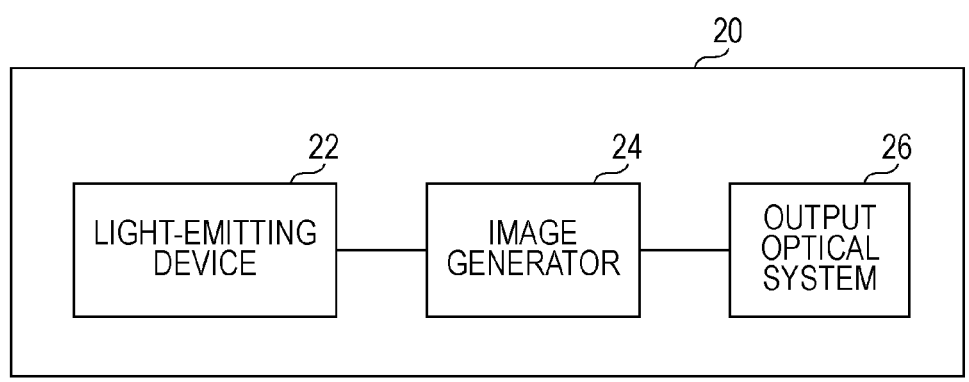
FIG. 2 is a schematic view illustrating an exemplary configuration of projection units according to a third embodiment of the present disclosure.

A specific configuration of the projection units of the third embodiment will be described below with reference to the drawing, but the scope of the present disclosure is not limited to such a configuration. FIG. 2 is a schematic view illustrating an exemplary configuration of a projection unit 20 according to the third aspect. The projection unit 20 includes a light-emitting device 22 defining a light source section, an image generator 24 and an output optical system 26.

The light-emitting device 22 is the light-emitting device of the second embodiment. Specifically, for example, the light-emitting device 22 includes an excitation light source and a color wheel 30.

For example, the excitation light source may be a semiconductor light-emitting element (such as an LD or an LED) that emits light having a peak wavelength in the wavelength range of 380 nm to 420 nm. For example, the semiconductor light-emitting element may be one which has an emitting layer including a gallium nitride compound semiconductor.

Figure 3:
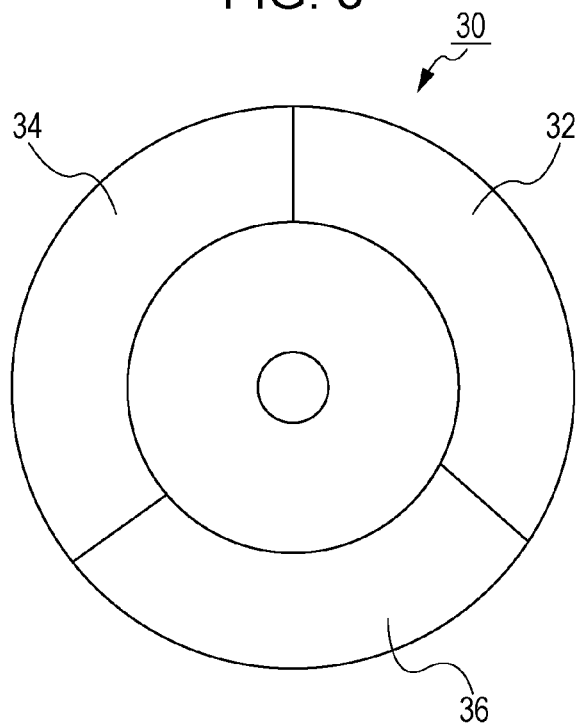
FIG. 3 is a schematic view illustrating an exemplary configuration of a color wheel of the projection unit depicted in FIG. 2.

FIG. 3 is a schematic view illustrating an exemplary configuration of the color wheel 30. The color wheel 30 has a disk shape and is rotatable. The color wheel 30 has a blue light-emitting section 32, a red light-emitting section 34 and a green light-emitting section 36 that output blue light, red light and green light, respectively, upon receiving the light from the excitation light source.

Figure 4:
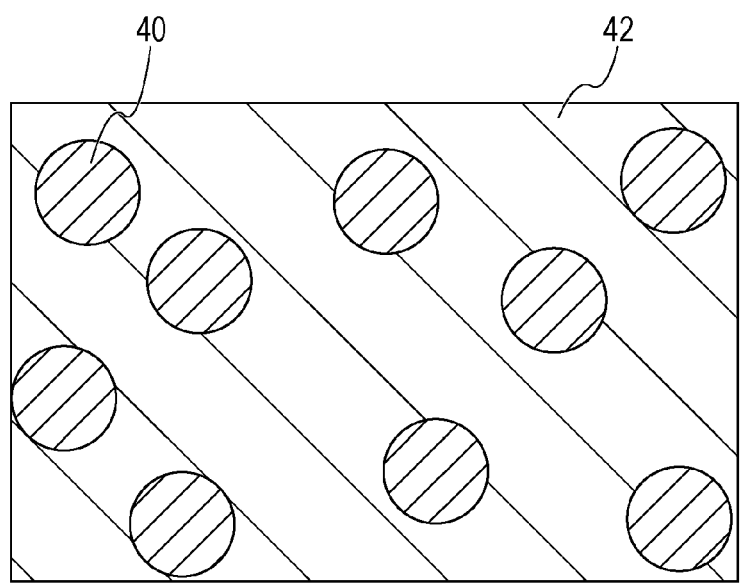
FIG. 4 is a schematic view illustrating an exemplary configuration of a blue light-emitting section of the color wheel depicted in FIG. 3.

FIG. 4 is a schematic view illustrating an exemplary configuration of the blue light-emitting section 32. The blue light-emitting section 32 has a phosphor layer which includes a matrix 42 and a phosphor 40 dispersed in the matrix 42 wherein the phosphor 40 is the phosphor of the first embodiment that emits blue light. The matrix 42 may be an inorganic material or an organic material. Examples of the matrixes 42 include resins, glasses, ZnO crystals and ceramics.

Similarly, the red light-emitting section 34 and the green light-emitting section 36 each have a phosphor layer which includes a matrix and a red phosphor or a green phosphor dispersed in the matrix.

These phosphors absorb at least part of the light emitted from the semiconductor light-emitting element and emit blue light, red light and green light, respectively, having a peak wavelength in a range of wavelengths longer than the light absorbed by the phosphor.

The color wheel 30 may have light-emitting sections other than the blue light-emitting section 32, the red light-emitting section 34 and the green light-emitting section 36 (for example, may have a white light-emitting section, a yellow light-emitting section, a cyan light-emitting section and a magenta light-emitting section).

The light-emitting device 22 may have a condenser lens between the excitation light source and the color wheel 30. The light-emitting device 22 may have a relay lens so that the light from the color wheel 30 is output as focused light. The light-emitting device 22 may have a rod lens.

The light that has passed through the color wheel is output from the light-emitting device 22. The image generator 24 generates an image using the light from the light-emitting device 22. For example, the image generator 24 has a spatial light modulator (SLM) such as a digital micromirror device (DMD).

The output optical system 26 outputs the image created by the image generator 24. For example, the output optical system 26 has a projection lens including a plurality of lenses.

The image that is output is projected on a surface that is outside the projection unit 20 such as a wall, a screen or a window glass (for example, an automobile front glass or an airplane front glass).

The projection unit 20 may have a filter (for example, a filter that blocks light having wavelengths of 420 nm or less). Other configurations of the projection unit 20 may be conventional and may involve additional optical components such as lenses other than those described above, mirrors and prisms as required.

The projection units such as projectors and head-up displays according to the present embodiment achieve high efficiency.

Fourth Embodiment

The fourth embodiment is directed to a vehicle including the light-emitting device of the second embodiment. Examples of the vehicles include automobiles, motorbikes, trains, streetcars, construction vehicles and agricultural vehicles.

Figure 5:
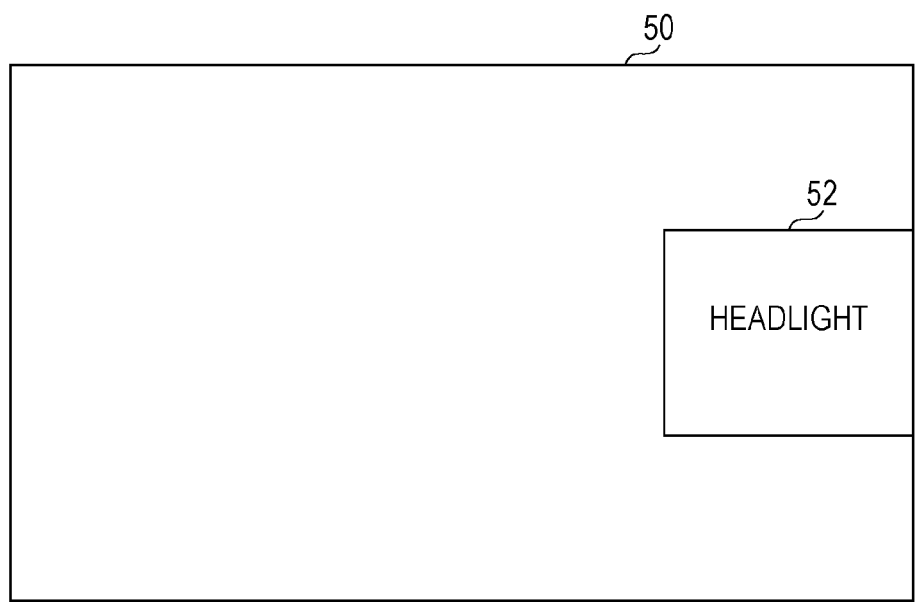
FIG. 5 is a schematic view illustrating an exemplary configuration of vehicles according to a fourth embodiment of the present disclosure.

A specific configuration of the vehicles of the fourth embodiment will be described below with reference to the drawings, but the scope of the present disclosure is not limited to such a configuration. FIG. 5 is a schematic view illustrating an exemplary configuration of a vehicle 50 which includes the light-emitting device of the second embodiment in a headlight. The vehicle 50 has a headlight 52 that includes the light-emitting device of the second embodiment and an output optical system which outputs light from the light-emitting device toward the front of the headlight.

Figure 6:
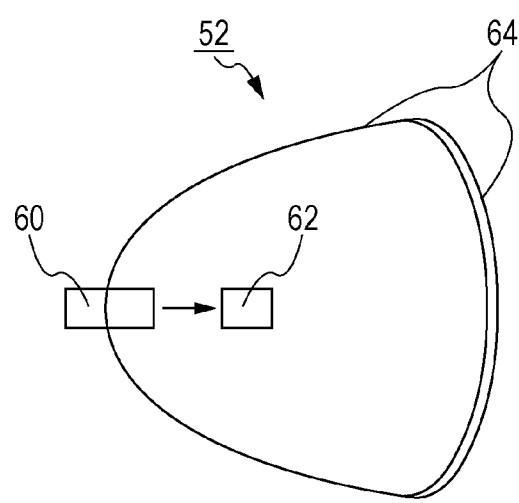
FIG. 6 is a schematic view illustrating an exemplary configuration of the headlight depicted in FIG. 5.

FIG. 6 is a schematic view illustrating an exemplary configuration of the headlight 52. The headlight 52 includes an excitation light source 60, a wavelength converter 62 and an output optical system 64 that outputs light from the wavelength converter 62 toward the front of the headlight.

For example, the excitation light source 60 may be a semiconductor light-emitting element (such as an LD or an LED) that emits light having a peak wavelength in the wavelength range of 380 nm to 420 nm. For example, the semiconductor light-emitting element may be one which has an emitting layer including a gallium nitride compound semiconductor. The excitation light source 60 may have an optical fiber that guides light from the semiconductor light-emitting element.

Figure 7:
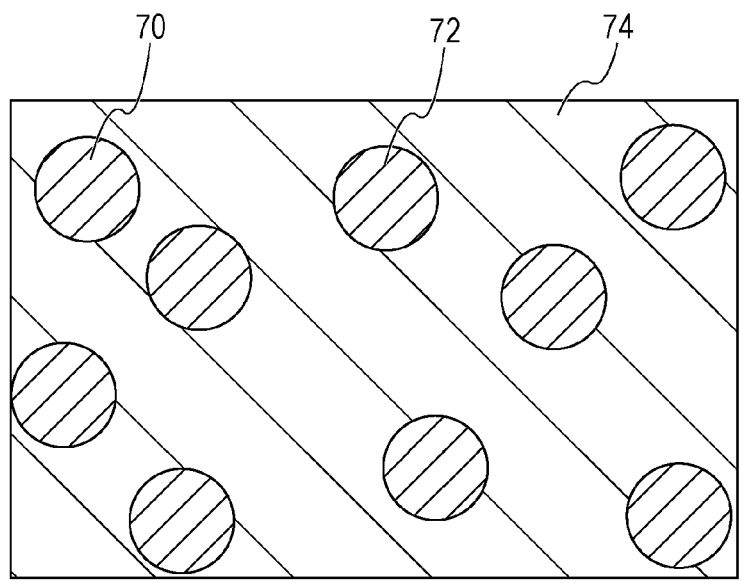
FIG. 7 is a schematic view illustrating an exemplary configuration of a wavelength converter in the headlight depicted in FIG. 6.

The wavelength converter 62 receives the excitation light from the excitation light source 60 and emits light having a longer wavelength than the excitation light. For example, as illustrated in FIG. 7, the wavelength converter 62 has a phosphor layer which includes a matrix 74 and phosphors dispersed in the matrix 74 wherein the phosphors include a phosphor 70 of the first embodiment that emits blue light and a yellow phosphor 72. The matrix 74 may be an inorganic material or an organic material. Examples of the matrixes 74 include resins, glasses, ZnO crystals and ceramics.

The phosphors 70 and 72 absorb at least part of the light emitted from the semiconductor light-emitting element and emit blue light and yellow light, respectively, having a peak wavelength in a range of wavelengths longer than the light absorbed by the phosphor. The blue light and the yellow light are mixed to produce white light. The combination of phosphors is not limited to the one described above and may include, for example, the phosphor of the first embodiment, a red phosphor and a green phosphor.

The output optical system 64 outputs the light from the wavelength converter 62 toward the front of the headlight. For example, the output optical system includes a reflector and an output lens.

The headlight 52 may have a filter (for example, a filter that blocks light having wavelengths of 420 nm or less).

The configuration of the vehicle 50 other than the headlight 52 may be conventional.

The vehicles having the above configuration may emit light toward the front with high efficiency.

Besides the configurations described above, the vehicles of the fourth embodiment may have the light-emitting devices of the second embodiment for other purposes such as interior illuminations and instrument backlights.

EXAMPLES

Hereinbelow, the phosphors of the present disclosure will be described in detail based on Examples and Comparative Examples without limiting the scope of the present disclosure to such Examples.

(Preparation of Phosphor Samples)

$SrCO_3$ (99.9% purity), $Eu_2O_3$ (99.9% purity), $MgCO_3$ (99.9% purity) and $SiO_2$ (99.9% purity) were used as starting materials. These materials were weighed in a prescribed composition and were mixed together by a wet process in pure water with use of a ball mill.

The mixture was dried at 150° C. for 10 hours and the dry powder was pre-calcined in the air at 1100° C. for 4 hours. The pre-calcined product was calcined in a mixed gas containing 98 vol % nitrogen and 2 vol % hydrogen at 1200 to 1400° C. for 4 hours. A phosphor was thus obtained.

(Evaluation Methods)

The phosphor obtained was analyzed with an X-ray diffractometer (RINT2100 manufactured by Rigaku Corporation, Cu—Kα radiation) to measure an X-ray diffraction pattern. The X-ray diffraction pattern obtained was analyzed to determine the X-ray diffraction intensity ratio "a" (a=c/b wherein b was the diffraction intensity of the main $Sr_3MgSi_2O_8$ peak observed at 2θ of 31.8° to 32.8° and c was the diffraction intensity of the main $SrMgSiO_4$ peak detected at 2θ of 34° to 35.5°).

Further, the phosphor was irradiated with blue-violet light (405 nm excitation) and an emission spectrum was recorded with a spectrofluorophotometer (FP-6500 manufactured by JASCO Corporation).

Table 1 describes the compositional ratios and the X-ray diffraction intensity ratios "a" of the phosphors produced.

Table 1 also describes the ratios of the number of photons obtained based on the results of the measurement of emission spectra. The ratios of the number of photons are values relative to the sample No. 1. In Table 1, the sample with an asterisk mark (*) represents Comparative Example and the samples without an asterisk mark represent Examples.

TABLE 1

| Sample No. | j | k | m | n | x | X-ray diffraction intensity ratio "a" | Photon number ratio (%) | Photon number ratio per unit volume (%) |
|---|---|---|---|---|---|---|---|---|
| *1 | 0 | 0 | 0 | 0 | 0.02 | 0 | 100 | 100 |
| 2 | 0.05 | 0.05 | 0.05 | 0.20 | 0.02 | 0.01 | 110 | 117 |
| 3 | 0.20 | 0.20 | 0.20 | 0.80 | 0.02 | 0.03 | 121 | 146 |
| 4 | 0.40 | 0.40 | 0.40 | 1.60 | 0.02 | 0.06 | 128 | 183 |
| 5 | 0.60 | 0.60 | 0.60 | 2.40 | 0.02 | 0.10 | 117 | 190 |
| 6 | 1.00 | 1.00 | 1.00 | 4.00 | 0.02 | 0.18 | 112 | 222 |
| 7 | 2.00 | 2.00 | 2.00 | 8.00 | 0.02 | 0.42 | 93 | 290 |
| 8 | 0.60 | 0.60 | 0.60 | 2.40 | 0.005 | 0.11 | 112 | 220 |
| 9 | 0.60 | 0.60 | 0.60 | 2.40 | 0.04 | 0.10 | 119 | 242 |
| 10 | 0.60 | 0.60 | 0.60 | 2.40 | 0.08 | 0.09 | 115 | 227 |

From Table 1, the phosphor samples representing Examples except the sample No. 7 achieved higher luminescence quantum efficiency.

Regarding the photon number ratios of the samples described in Table 1, SrMgSiO$_4$:Eu does not emit light and therefore the phosphors have a smaller luminescent volume with increasing proportion of the SrMgSiO$_4$ crystal. Thus, the volume ratios of Sr$_3$MgSi$_2$O$_8$ and SrMgSiO$_4$ were calculated to determine the photon number ratio per unit volume of Sr$_3$MgSi$_2$O$_8$:Eu responsible for the emission of light, the results being described in Table 1. This correction shows that all the phosphor samples including the sample No. 7 which were mixed crystals of Sr$_3$MgSi$_2$O$_8$ and SrMgSiO$_4$ outperformed the sample No. 1 which was a Sr$_3$MgSi$_2$O$_8$ single crystal phosphor. Specifically, all the samples Nos. 2 to 10 representing Examples released a larger number of photons during the emission of light at Sr$_3$MgSi$_2$O$_8$:Eu than the conventional SMS phosphor.

From the viewpoint of the quantum efficiency of the whole phosphor, high practicality is obtained when the X-ray diffraction intensity ratio "a" is 0.01≤a≤0.18, and still higher practicality is obtained when the X-ray diffraction intensity ratio "a" is 0.03≤a≤0.06. Further, high practicality is obtained when the composition of the host crystal of the phosphor is represented by the general formula Sr$_{3+j}$Mg$_{1+k}$Si$_{2+m}$O$_{8+n}$ (0<j≤1.0, 0<k≤1.0, 0<m≤1.0, and 0<n≤4.0).

(Manufacturing of Light-Emitting Devices)

Phosphors were prepared in the same manner as the samples Nos. 1 to 4. The phosphor was then kneaded together with a dimethylsilicone resin in a three-roll kneader to give a mixture. The mixture was charged into a mold, was then degassed by vacuum degassing, and was joined with 600 μm square gallium nitride semiconductor light-emitting elements (peak wavelength 405 nm) that had been wired on a substrate. The mixture was pre-cured by heating at 150° C. for 10 minutes. After the mold was removed, curing was performed at 150° C. for 4 hours. Consequently, light-emitting devices illustrated in FIG. 1 were obtained. In the mixture of the phosphor and the resin, the weight ratio of the phosphor was 50 wt %.

The samples of Examples and Comparative Example were energized by the application of 500 mA current with a pulse width of 30 ms, and the blue light that was emitted was analyzed with a total luminous flux measurement system (HM, 300 mm diameter) to determine the emission efficiency.

Table 2 describes the sample Nos. of the phosphors used in the light-emitting devices manufactured, and the emission efficiencies of the light-emitting device samples. The emission efficiencies are values relative to the sample No. 11. In Table 2, the sample with an asterisk mark (*) represents Comparative Example and the samples without an asterisk mark represent Examples.

TABLE 2

| Sample No. | Phosphor used | Relative emission efficiency (%) |
|---|---|---|
| *11 | Sample No. 1 | 100 |
| 12 | Sample No. 2 | 114 |
| 13 | Sample No. 3 | 123 |
| 14 | Sample No. 4 | 134 |

As clear from Table 2, the light-emitting devices of Examples achieved high emission efficiency.

The light-emitting devices which have a phosphor layer containing the phosphor of the present disclosure achieve high efficiency and are useful in various applications. Specifically, the light-emitting devices may be used in applications where light-emitting diodes (LEDs) or semiconductor laser diodes (LDs) and phosphors are used such as light sources for projection units, light sources for vehicle headlights, light sources for white LED lights, flash light sources for image recording apparatuses and backlight sources for liquid crystal displays, as well as in applications where phosphors are used such as sensors, intensifiers and plasma display panels (PDPs).

What is claimed is:

1. A phosphor comprising a host crystal including Sr$_3$MgSi$_2$O$_8$ crystal and SrMgSiO$_4$ crystal, the phosphor being a blue phosphor including Eu$^{2+}$ as a luminescent center or being a blue and red dual emission phosphor including Eu$^{2+}$ and Mn$^{2+}$ as luminescent centers.

2. A phosphor comprising a host crystal including Sr$_3$MgSi$_2$O$_8$ crystal and SrMgSiO$_4$ crystal, the phosphor being a blue phosphor including Eu$^{2+}$ as a luminescent center, and being free from Mn$^{2+}$ as a luminescent center.

3. The phosphor according to claim 1, wherein the phosphor has diffraction peaks at 2θ of 22° to 23°, 2θ of 30.6° to 31.7° and 2θ of 31.8° to 32.8° and also has diffraction peaks at 2θ of 28° to 30.4° and 2θ of 34° to 35.5° in an X-ray diffraction pattern measured with Cu—Kα radiation.

4. The phosphor according to claim 1, wherein the phosphor satisfies 0.01≤a≤0.18 wherein a is a value of the ratio c/b wherein b is the intensity of the largest diffraction peak assigned to the Sr$_3$MgSi$_2$O$_8$ crystal present at 2θ of 31.8° to 32.8° in an X-ray diffraction pattern of the phosphor measured with Cu—Kα radiation, and c is the intensity of the largest diffraction peak assigned to the SrMgSiO$_4$ crystal present at 2θ of 34° to 35.5° in the X-ray diffraction pattern.

5. The phosphor according to claim 1, wherein the host crystal of the phosphor has a composition represented by the general formula Sr$_{3+j}$Mg$_{1+k}$Si$_{2+m}$O$_{8+n}$ (0<j≤1.0, 0<k≤1.0, 0<m≤1.0, and 0<n≤4.0).

6. A light-emitting device comprising a phosphor layer containing a phosphor, the phosphor including a host crystal including Sr$_3$MgSi$_2$O$_8$ crystal and SrMgSiO$_4$ crystal, the phosphor being a blue phosphor including Eu$^{2+}$ as a luminescent center or being a blue and red dual emission phosphor including Eu$^{2+}$ and Mn$^{2+}$ as luminescent centers.

7. The light-emitting device according to claim 6, further comprising a semiconductor light-emitting element that emits light having a peak wavelength in the wavelength range of 380 nm to 420 nm, wherein the phosphor in the phosphor layer absorbs at least part of the light emitted from the semiconductor light-emitting element and emits light having a peak wavelength longer than the light absorbed by the phosphor.

8. The light-emitting device according to claim 7, wherein the semiconductor light-emitting element comprises an emitting layer including a gallium nitride compound semiconductor.

9. A projector comprising the light-emitting device of claim 6.

10. The projector according to claim 9, further comprising an image generator that generates an image using light emitted from the light-emitting device, and an output optical system that outputs the image generated by the image generator.

11. A vehicle comprising the light-emitting device of claim 6.

12. The vehicle according to claim 11, comprising a headlight including the light-emitting device and an output optical system that outputs light from the light-emitting device toward the front of the headlight.

13. A head-up display comprising the light-emitting device of claim 6.

14. The head-up display according to claim 13, further comprising an image generator that generates an image using light emitted from the light-emitting device, and an output optical system that outputs the image generated by the image generator.

* * * * *